United States Patent
Colpo et al.

(10) Patent No.: US 6,692,622 B1
(45) Date of Patent: Feb. 17, 2004

(54) PLASMA PROCESSING APPARATUS WITH AN ELECTRICALLY CONDUCTIVE WALL

(75) Inventors: Pascal Colpo, Annecy (FR); François Rossi, Bi Andronno (IT)

(73) Assignee: European Community (BE)

( * ) Notice: Subject to any disclaimer, the term of this patent is extended or adjusted under 35 U.S.C. 154(b) by 0 days.

(21) Appl. No.: 10/129,096

(22) PCT Filed: Sep. 29, 2000

(86) PCT No.: PCT/EP00/09997
§ 371 (c)(1),
(2), (4) Date: May 10, 2002

(87) PCT Pub. No.: WO01/37313
PCT Pub. Date: May 25, 2001

(30) Foreign Application Priority Data

Nov. 17, 1999 (EP) .......................................... 99402845

(51) Int. Cl.[7] ............................................... C23C 14/34
(52) U.S. Cl. ............................. 204/298.06; 204/298.07; 204/298.11; 118/723 I; 118/723 IR; 156/345.48; 156/345; 156/49
(58) Field of Search .................. 204/298.06, 298.07, 204/298.11; 118/723 I, 723 IR; 156/345.48, 345.49

(56) References Cited

U.S. PATENT DOCUMENTS

| | | | | |
|---|---|---|---|---|
| 4,431,901 A | * | 2/1984 | Hull ...................... | 219/121 PR |
| 5,763,851 A | * | 6/1998 | Forster et al. ......... | 204/298.11 |
| 5,885,358 A | * | 3/1999 | Maydan et al. ......... | 118/723 R |
| 6,074,516 A | * | 6/2000 | Howald et al. ........... | 118/723 I |
| 6,080,287 A | * | 6/2000 | Drewery et al. ....... | 204/192.15 |

FOREIGN PATENT DOCUMENTS

WO   WO 9641897   * 12/1996

* cited by examiner

Primary Examiner—Rodney G. McDonald (57) ABSTRACT

The plasma processing apparatus comprises a plasma chamber (1) bounded, on at least one side thereof, by an electrically conductive wall (10), said electrically conductive wall comprising one or several apertures (100) for interrupting a current path through said wall, external electromagnetic means (2) for supplying electromagnetic energy into the plasma chamber through the electrically conductive wall, thereby generating a plasma inside said chamber, and sealing means for sealing the apertures. The apparatus is characterised in that the sealing means comprises one or more electrically conductive enclosure elements which are electrically insulated from the electrically conductive wall.

29 Claims, 7 Drawing Sheets

PLASMA PROCESSING APPARATUS WITH AN ELECTRICALLY CONDUCTIVE WALL

FIELD OF THE INVENTION

The present invention pertains to a plasma processing apparatus useful in plasma-assisted processes such as etching, deposition or sputtering processes. More particularly, the invention relates to an Inductive Coupled Plasma source.

BACKGROUND OF THE INVENTION

Inductive Coupled Plasma sources are conventionally used for etching substrates or depositing material thereon. They are generally composed of a plasma chamber having a lateral dielectric wall surrounded by an external solenoid inductor. The plasma chamber contains a process gas. The external inductor is fed by a Radio Frequency generator and produces electromagnetic energy which is provided to the interior of the plasma chamber through the dielectric wall. A plasma is thus generated inside the chamber, by ionization of the process gas molecules.

The composition of the process gas is selected as a function of the treatment to be applied to the substrate. Thus, for example, if the plasma apparatus is used for material deposition on a substrate, the process gas will contain material elements to be deposited on this substrate. If the plasma apparatus is used as an etching apparatus, the process gas will contain reactive species that will react with the substrate and remove material therefrom.

An interesting characteristic of the plasma-assisted processes, in particular with respect to the Chemical Vapour Deposition technique, is that, by virtue of the use of the plasma, a lower substrate temperature is required in order to activate the reaction or deposition. Plasma-assisted processes may therefore be advantageously applied notably when the substrate to be treated cannot withstand high temperatures.

However, Inductive Coupled plasma sources remain expensive, in particular when they are shaped so as to have curved portions. The material from which their external wall is made, i.e. a dielectric material, is indeed not appropriate for the manufacture of complex pieces, such as curved or cylindrical pieces. Furthermore, drilling a hole in the dielectric material, for example in order to provide an access to the interior of the chamber for the process gas, is a difficult task.

WO-A-96/41897 describes a plasma treatment apparatus comprising a parallelepiped plasma chamber surrounded by electrical conductors. The side walls of the plasma chamber are composed of parallel metallic bars extending longitudinally over the length of the chamber. Gaps or slots are defined between the metallic bars in order to allow the magnetic field produced by the electrical conductors to penetrate into the interior of the plasma chamber. The plasma chamber is sealed by dielectric plates, each covering the external side of a corresponding chamber side wall.

The use of a dielectric plate for each side wall of the chamber may pose a problem when it is desired to have a chamber with a more complex shape, such as a cylindrical shape. Curved dielectric plates would indeed have to be constructed, which would significantly increase the manufacturing costs. Furthermore, the plasma chamber according to WO-A-96/41897 is not appropriate for providing a lateral access for the process gas, since such lateral access would require drilling a hole through a dielectric plate.

SUMMARY OF THE PRESENT INVENTION

The present invention aims at remedying the above-mentioned drawbacks.

To this end, there is provided a plasma processing apparatus comprising a plasma chamber comprising an electrically conductive wall, wherein said electrically conductive wall has at least one aperture for interrupting a current path in said wall when electromagnetic energy is provided into the chamber from the outside of the chamber, external electromagnetic means for supplying electromagnetic energy into said plasma chamber through said electrically conductive wall in order to create a plasma inside the chamber, and sealing means for sealing said at least one aperture, characterised in that said sealing means comprises at least one electrically conductive enclosure element which is electrically insulated from said electrically conductive wall.

Thus, according to the present invention, one or more electrically conductive enclosure elements are used to seal the aperture(s) defined on the conductive wall of the plasma chamber. The plasma chamber is therefore essentially made from an electrically conductive material, such as metal, which renders the construction of the chamber more flexible. In particular, the chamber may have a complex shape, without the manufacturing costs significantly increasing, since conductive materials may be machined and deformed rather easily.

Furthermore, as the conductive enclosure elements are electrically insulated from the conductive wall, a current path through the conductive wall is interrupted at the level of the aperture(s), thus preventing a current loop to be formed all around the conductive wall when electromagnetic energy is supplied to the interior of the chamber. By virtue of the provision of the aperture(s) and of the fact that the conductive enclosure element(s) is insulated from the conductive wall, the electromagnetic energy produced by the external electromagnetic means is not or little screened out by the conductive wall. An important portion of the electromagnetic energy produced by the external electromagnetic means is therefore effectively supplied to the inside of the chamber.

Preferably, said at least one aperture extends in a first direction which is substantially parallel to the magnetic field induced by the external electromagnetic means, so as to interrupt a current path through the electrically conductive wall in a direction orthogonal to said first direction.

In practice, the electrically conductive wall extends in a direction parallel to a longitudinal axis of the plasma chamber, and said at least one aperture extends in a direction which is substantially parallel to the longitudinal axis of the plasma chamber, so as to interrupt a current path through said electrically conductive wall in a direction orthogonal to said longitudinal axis.

The plasma chamber may further comprise end plates at opposite ends of the electrically conductive wall, which end plates extend perpendicularly to the conductive wall.

The plasma chamber may be cylindrical, with the electrically conductive wall forming the cylindrical face of the plasma chamber, or parallelepiped, with the electrically conductive wall being composed of plane adjacent faces of the chamber. The plasma chamber may also be of any other suitable shape, and in particular of a shape that is adapted to the shape of the substrate to be plasma treated.

The external electromagnetic means may comprise an inductor surrounding the electrically conductive wall and connected to an AC power supply.

According to the present invention, at least one insulating means or electrically non-conductive gasket is provided for electrically insulating each conductive enclosure element from the conductive wall.

Preferably, each non-conductive gasket is disposed on the conductive wall in such a manner as to be in indirect line of sight from the interior of the chamber, i.e. from the plasma generated inside the chamber. This feature is particularly advantageous when the plasma processing apparatus according to the invention is used for depositing or sputtering electrically conductive material, such as metal. Indeed, in such a case, there would be a risk that a continuous layer of such conductive material be coated on the non-conductive gasket when the plasma deposition or sputtering process is being carried out. This could result in the creation of a current loop all around the conductive wall of the chamber and, accordingly, in the electromagnetic energy supplied by the external electromagnetic means being screened out by this continuous layer in the manner as explained above.

By avoiding any direct line of sight between the interior of the chamber and the insulating gasket, the risk of energy screening out due to conductive material deposition on the chamber wall is prevented or at least greatly reduced. This result is attained without the present invention requiring any Faraday shield within the chamber, nor any additional complex labyrinth structure, as conventionally used in the prior art. Furthermore, as the enclosure element(s) is/are made of a conductive material, such as metal, the deposition of conductive material thereon is not detrimental. The present invention makes it thus possible to use wide apertures or slots on the conductive wall in order to simplify the construction of the apparatus and to reduce its cost.

Typically, said at least one aperture consists of a plurality of apertures, said at least one electrically conductive enclosure element consists of a plurality of electrically conductive enclosure elements, and each one of the plurality of conductive enclosure elements is mounted on the electrically conductive wall in registration with a corresponding one of the plurality of apertures.

According to an embodiment of the present invention, said at least one gasket consists of a plurality of gaskets, each one of the plurality of gaskets surrounding, on an external surface of the electrically conductive wall, a corresponding one of the plurality of apertures, and each one of the plurality of electrically conductive enclosure elements is applied on a corresponding one of the plurality of gaskets.

According to another embodiment of the present invention, each one of the plurality of apertures comprises a narrow portion emerging into the plasma chamber and a wider portion communicating with the narrow portion and forming a recess on an external surface of the electrically conductive wall. Each one of a plurality of gaskets surrounds, in the recess of a corresponding aperture, the narrow portion of the corresponding aperture, and each one of the plurality of conductive elements is applied on a corresponding gasket in the recess of a corresponding aperture.

Advantageously, the at least one gasket and the at least one conductive enclosure element are removably mounted on the conductive wall. Preferably, a gap between the at least one conductive enclosure element and the conductive wall is determined according to the Paschen's law, such that no plasma is generated between the conductive enclosure element(s) and the conductive wall. Typically, the gap may be less than one millimeter.

The plasma chamber may further comprise one or several sputtering targets. These sputtering targets may be disposed on an inner surface of the conductive wall. An insulating plate may be interposed between the sputtering targets and the inner surface of the conductive wall. The sputtering source may be connected to a power source by a lead crossing the conductive wall and electrically insulated from the conductive wall.

According to another advantageous feature of the present invention, the plasma chamber comprises at least one gas inlet formed on the electrically conductive wall. This gas inlet serves to supply the inside of the chamber with a process gas. Preferably, the at least one gas inlet consists of a plurality of gas inlets provided at regular intervals on the electrically conductive wall. The process gas can thus be introduced into the chamber with a uniform distribution.

In addition to the above-mentioned gas inlets, the plasma chamber may further comprise one or more gas inlets formed on a cover plate disposed at the top or the bottom of the chamber. The gas inlets on the conductive wall may then serve to supply the interior of the chamber with a reactive gas mixture, while the gas inlets provided on the cover plates may be used for introducing inert gases whose role notably consists in facilitating the mixing of the various elements contained in the gas mixture. The gas inlets provided on the conductive wall, which forms a lateral wall of the chamber, enable the introduction of the reactive gas mixture into the chamber in an area close to the substrate to be treated. In this way, the present invention avoids supplying the reactive gas mixture to areas which are remote from the substrate and which therefore need not receive the gas mixture.

In practice, the at least one electrically conductive enclosure element preferably consists of one or several plates, and both the conductive wall and the plates are made of metal. Furthermore, the at least one aperture may take the form of one or several slots.

DETAILED DESCRIPTION OF THE PRESENT INVENTION

Figure 1:
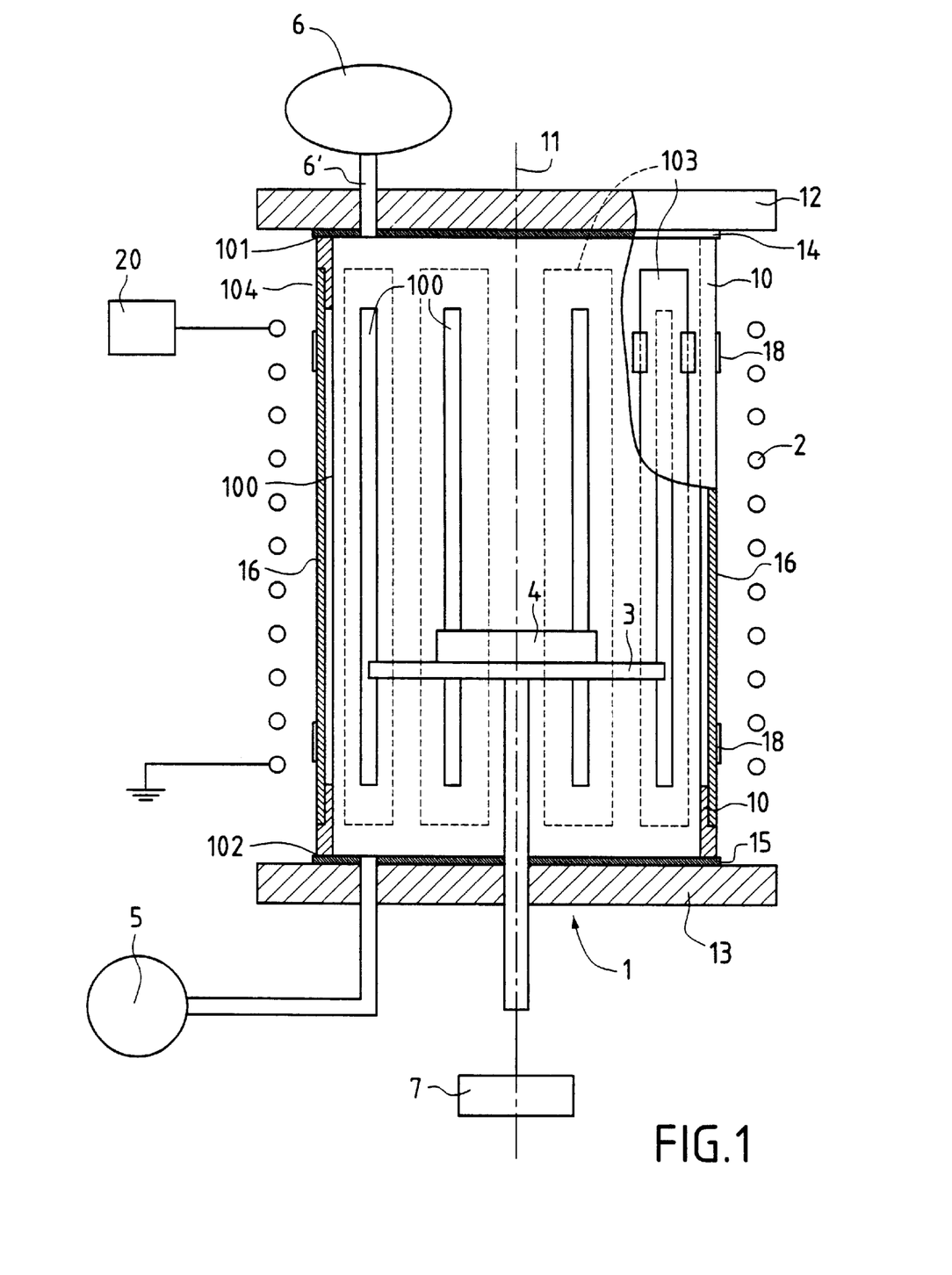
FIG. 1 is a partial sectional front view of a plasma apparatus according to a first embodiment of the present invention.

FIG. 1 shows an Inductively Coupled Plasma apparatus according to a first embodiment of the present invention. The plasma apparatus according to this first embodiment is used as a Plasma Enhanced Chemical Vapour Deposition apparatus, in order to deposit material layers on substrates.

It generally comprises a plasma, or process, chamber 1 containing a process gas, an external inductor 2 for creating a plasma inside the plasma chamber 1, a holder 3, disposed within the plasma chamber, for supporting a substrate 4, a pump device 5 for evacuating the plasma chamber 1, and a gas controller 6 for supplying the plasma chamber with the said process gas through a gas inlet 6'.

The holder 3 is connected to a power source 7 thereby enabling the substrate 4 to be biased. The holder 3 may also be connected to a heating or cooling system (not shown) for temperature regulation of the substrate.

The pump device 5 serves to evacuate the plasma chamber 1 before the latter is used. The gas controller 6 supplies a process gas composed of a reactive gas, comprising species that are to be deposited on the upper surface of the substrate, and an inert gas, enabling an efficient mixing of the various compounds contained in the process gas.

The inductor 2 is connected to a Radio Frequency (RF) power source 20 and provides RF magnetic energy, the frequency of which preferably ranges between 100 kHz and 100 MHz. Such RF magnetic energy permits the transformation of the process gas into a plasma, whose reactive species will deposit on the substrate 4.

The general characteristics and operation of a plasma apparatus are known to the skilled person, and will not therefore be explained in detail.

Figure 2:
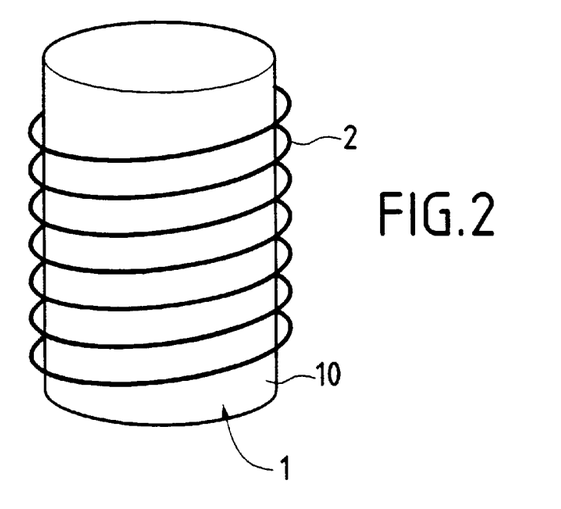
FIGS. 2 and 3 are perspective views respectively showing a plasma apparatus according to the invention with a cylindrical shape and a rectangular parallelepiped shape.
Figure 3:
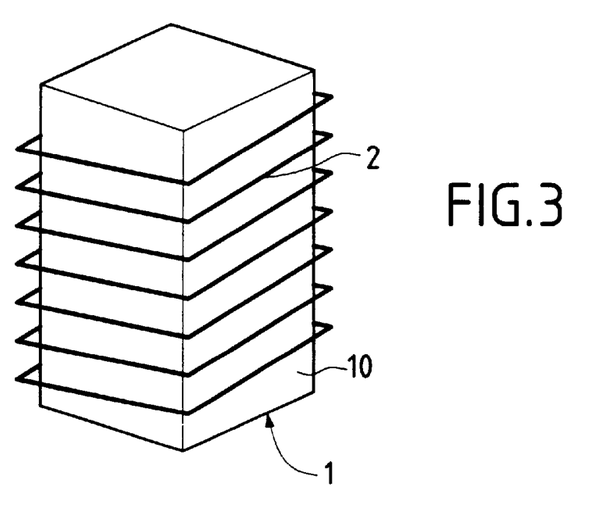

The plasma chamber 1 according to the present invention may have a cylindrical shape, as shown in FIG. 2, or any other suitable shape adapted to the shape of the substrate 4. FIG. 3 shows, as an example, a plasma chamber according to the invention having a parallelepiped shape.

The plasma chamber 1 comprises a lateral wall 10 extending along and about a longitudinal axis 11 of the plasma chamber and facing the inductor 2. The lateral wall 10 is cylindrical in the case of a cylindrical plasma chamber, or constituted by four plane wall portions if the plasma chamber has a parallelepiped shape. The plasma chamber 1 further comprises upper and lower end plates 12, 13 which are perpendicular to the longitudinal axis 11. The upper and lower end plates 12, 13 are respectively sealed to end surfaces 101, 102 of the lateral wall 10 by vacuum seals 14, 15.

According to the present invention, the lateral wall 10 of the plasma chamber 1 is made of a conductive material, such as metal. Furthermore, a plurality of apertures 100 are defined through the whole thickness t of the lateral wall 10 (see FIG. 5). The apertures 100 preferably extend in a direction parallel to the longitudinal axis 11, in the form of slots. The apertures 100 may extend over the whole length of the plasma chamber, i.e. between the end surfaces 101, 102 of the lateral wall 10, to contribute to the formation of a plasma in a large area within the chamber, or over a substantial portion of this length, as shown in FIG. 1.

The inductor 2 surrounds the lateral wall 2 at the outside of the plasma chamber in order to generate, within the chamber 10, an inductive field whose lines are parallel to the longitudinal axis 11 and to the slots 100.

Figure 4:
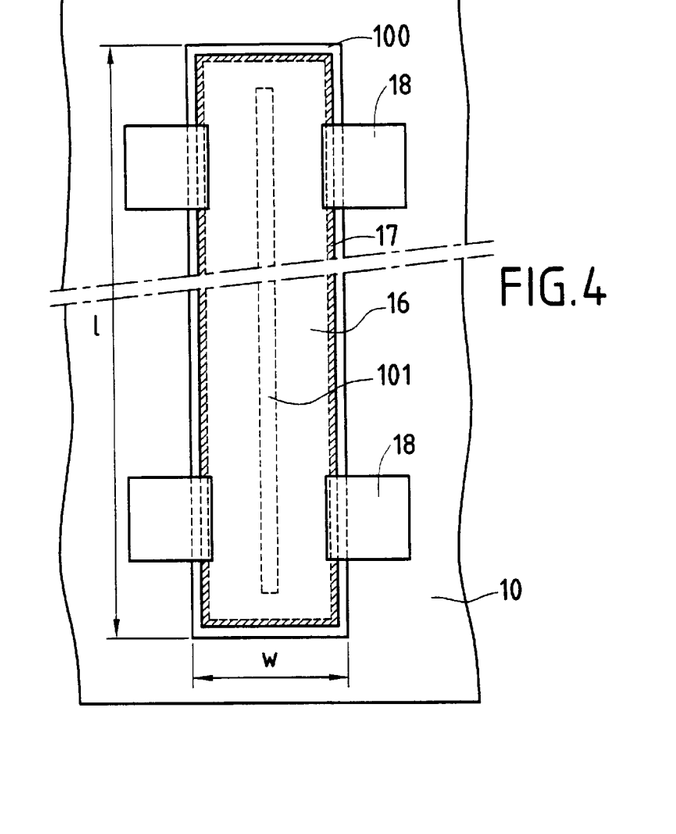
FIG. 4 is a diagrammatic front view of a part of a plasma chamber wall included in the plasma apparatus shown in FIG. 1.
Figure 5:
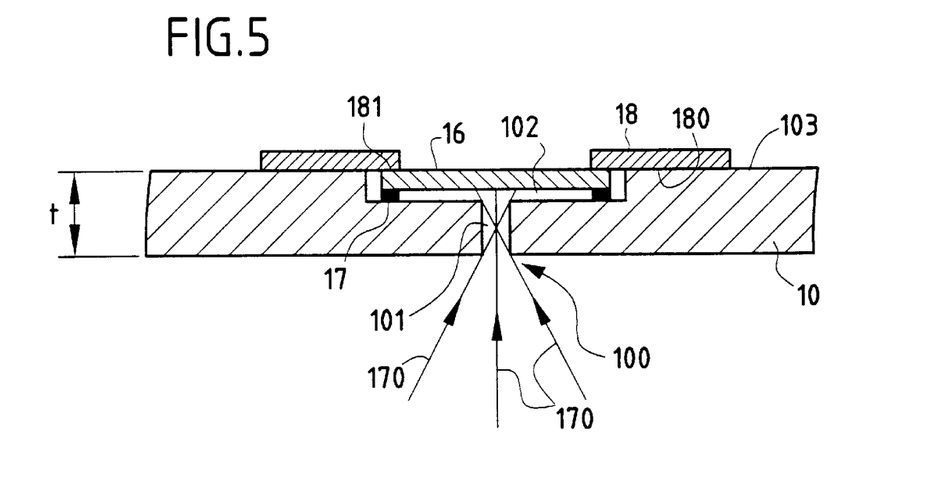
FIG. 5 is a diagrammatic top view of a part of a plasma chamber wall included in the plasma apparatus shown in FIG. 1.

FIGS. 4 and 5 show in more detail the apertures 100 formed on the conductive wall 10, in the case where the plasma chamber 1 is parallelepiped. Each aperture 100 is composed of a narrow portion 101 emerging into the inside of the plasma chamber 1, and a wider portion 102 defined on the external surface 103 of the conductive wall 10 and forming a recess which communicates with the narrow portion 101. The recess 102 has a larger width w (orthogonal to the longitudinal axis 11) and preferably a larger length l (parallel to the longitudinal axis 11) than those of the narrow portion 101, as shown in FIG. 4.

According to the present invention, the apertures, or slots, 100 are sealed, i.e. hermetically closed, by conductive enclosure elements 16 which close the apertures and by vacuum seals or gaskets 17 which electrically insulate the conductive enclosure elements 16 from the conductive wall 10. The conductive enclosure elements 16 are made of a metal, such as aluminium. They preferably have the same shape as that of the recesses 102 (rectangular on FIG. 5), but a slightly smaller size. The conductive enclosure elements 16 may each take the form of a plate, which may be plane if the chamber 1 is parallelepiped or curved if the chamber 1 is cylindrical. The gaskets 17 are made of an insulating material, such as a dielectric material.

The conductive elements 16 are mounted within the recesses 102 by appropriate electrically non-conductive mounting members 18. Two mounting members 18, disposed over opposite lateral sides of the recess 102, are provided in order to mechanically fit a given conductive element 16 to the wall 10. Each mounting member 18 has a surface portion 180 which is fixed on the external surface 103 of the conductive wall 10 and another surface portion 181 on which a peripheral portion of the upper surface of the conductive element 16 is fixed. Fixing of the mounting members 18 to the wall 10 and the conductive element 16 may be carried out by bonding or screwing.

The gaskets 17 preferably have a shape corresponding to that of the recesses 102 and the conductive elements 16, i.e. rectangular in the embodiment shown in FIGS. 4 and 5. Each gasket 17 is disposed between a lower surface of the recess 102 and a peripheral portion of the lower surface of the conductive element 16, thereby sealing the aperture 100.

Figure 6:
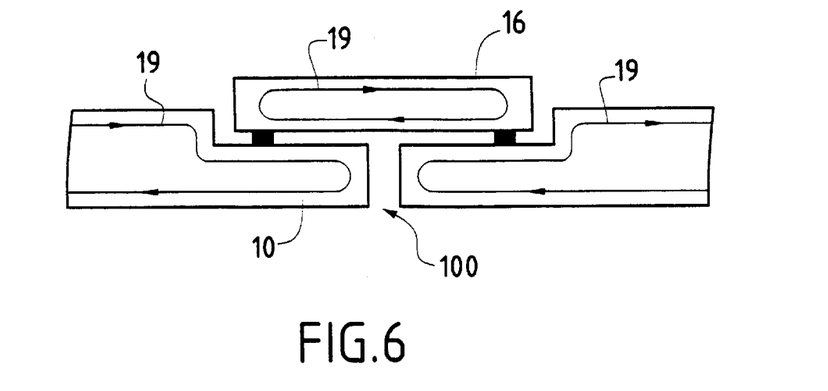
FIG. 6 is a diagrammatic top view of a part of a plasma chamber wall included in the plasma apparatus shown in FIG. 1, illustrating current paths.

The apertures 100 serve to interrupt a current path through the conductive wall 10 or, in other words, to break down circulating currents induced in the conductive wall 10 into plural current loops. Indeed, the current induced by the RF inductor 2 in the conductive wall 10 would, in the absence of such apertures, define a continuous loop around the wall 10, which would screen out the electromagnetic energy delivered by the RF inductor 2. As illustrated in FIG. 6, according to the present invention, currents 19 are induced in each electrically conductive parts, namely the wall portions on both sides of an aperture 100, and each conductive element 16, but there is no current path that surrounds the conductive wall 10.

Preferably, the gaskets 17 are each disposed in such a manner as to be in indirect line of sight from the interior of the chamber 1. As shown in FIG. 5, there is thus no direct line of sight 170 between each gasket 17 and the interior of the chamber 1. This is achieved, for example, by the conductive enclosure element 16 being much wider than the narrow portion 101 and the gasket 17 being disposed close to the periphery of the conductive element 16. Such an arrangement makes it possible to avoid the possible formation of conductive layers on the gasket 17 when the plasma chamber 1 is used for depositing conductive material, such as metal, on the substrate 4.

Figure 7:
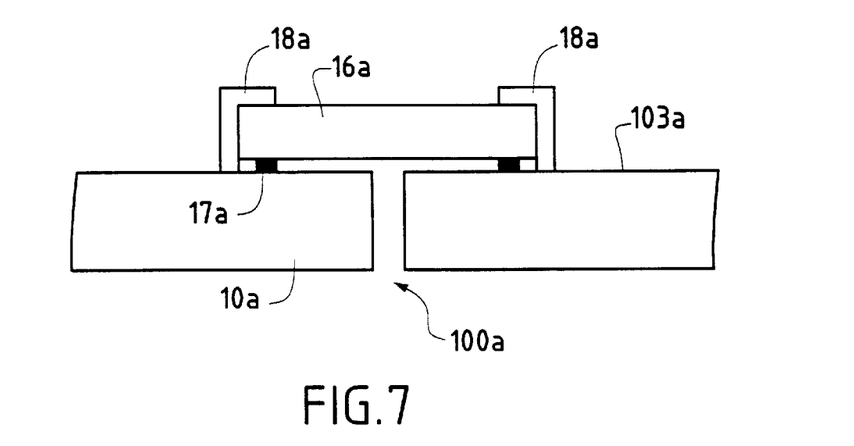
FIG. 7 is a diagrammatic top view of a part of a plasma chamber wall included in a plasma apparatus according to a second embodiment of the present invention.

With reference to FIG. 7, a plasma apparatus according to a second embodiment of the present invention differs from the first embodiment as previously described essentially in that the apertures 100a do not comprise any recess. Instead of being mounted in a corresponding recess, each conductive enclosure element 16a is mounted on the external surface 103a of the conductive wall 10a by non-conductive mounting members 18a and, for this purpose, has dimensions (length, width) larger than that of the corresponding aperture 100a. A gasket 17a surrounding the aperture 100a seals the gap between the conductive element 16a and the conductive wall 10a.

Figure 8:
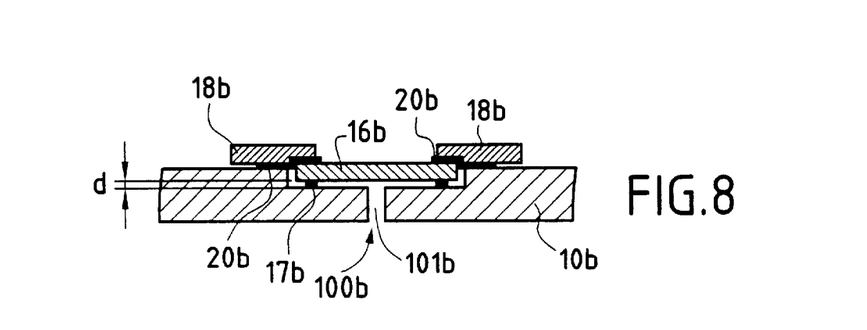
FIG. 8 is a diagrammatic top view of a part of a plasma chamber wall included in a plasma apparatus according to a third embodiment of the present invention.

With reference to FIG. 8, a plasma apparatus according to a third embodiment of the present invention differs from the first embodiment as previously described essentially in that:

seals 20b are provided between the non-conductive mounting members 18b and the conductive elements 16b, and the seal 17b which surrounds the narrow portion 101b of a given aperture 100b has a flat shape thereby defining an accurate gap d between the corresponding conductive element 16b and the conductive wall 10b in a direction transverse to the longitudinal axis 11 of the plasma chamber 1.

In this third embodiment, the gap d is adjusted according to the Paschen's law, such that no plasma is created therein. Typically, for an operating pressure inside the plasma chamber of 100 mTorr, the gap d is less than 1 mm. The adjustment is carried out by using several calibrated inserts with different thicknesses for the seal 17b. The seal 17b, the conductive element 16b, the seals 20b and the mounting members 18b are removably mounted, thus enabling the replacement, on the plasma chamber, of the insert 17b by another insert having a different thickness.

Figure 9:
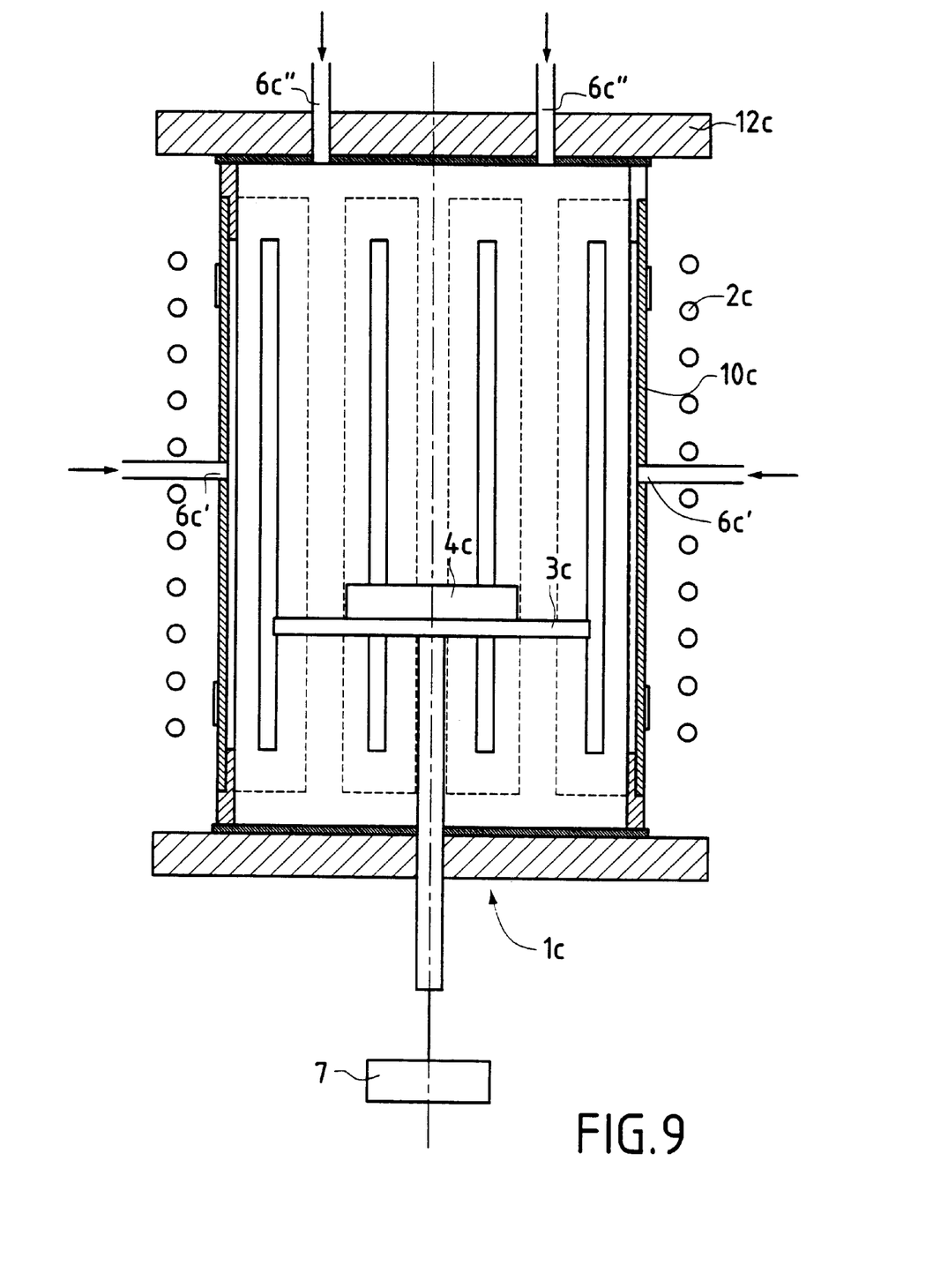
FIG. 9 is a sectional front view showing a plasma apparatus according to a fourth embodiment of the present invention.
Figure 10:
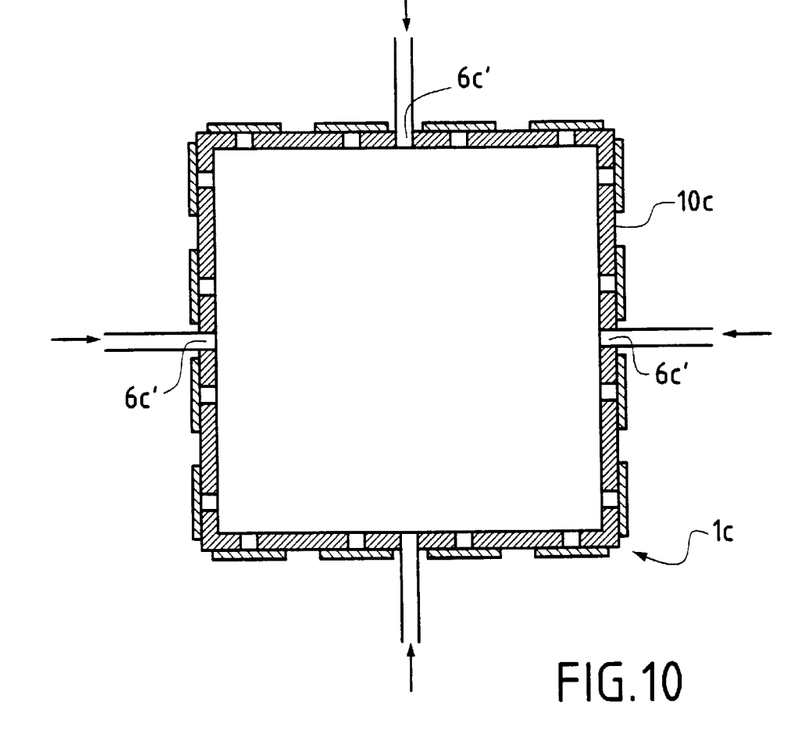
FIG. 10 is a top sectional view of the plasma apparatus according to the fourth embodiment of the present invention.

FIGS. 9 and 10 show a plasma apparatus according to a fourth embodiment of the present invention. The plasma apparatus according to this fourth embodiment essentially has the same structure as that of the first embodiment as previously described, except that one or several gas inlets 6c' are provided on the lateral conductive wall 10c, and one or several gas inlets 6c" are provided on the upper end plate 12c.

As shown in FIG. 10, the gas inlets 6c' formed on the lateral wall 10c are disposed at regular intervals between each other. The gas inlets 6c' serve to supply the interior of the plasma chamber 1c with a gas mixture containing the reactive species. The gas inlets 6c" formed on the upper end plate 12c serve to supply the interior of the plasma chamber 1c with an inert gas, whose role notably consists in facilitating the mixing of the various elements contained in the reactive gas mixture. The arrangement as illustrated in FIGS. 9 and 10 has the advantage of enabling a gas injection in an area close to the substrate 4c to be treated, thus avoiding to supply process gas to areas within the chamber 1c which need not receive such gas. Furthermore, the fact that the gas inlets 6c' on the lateral wall 10c are placed at regular intervals permit to have to uniform distribution of the gas mixture within the chamber 1c in the area of the substrate 4c.

Figure 11:
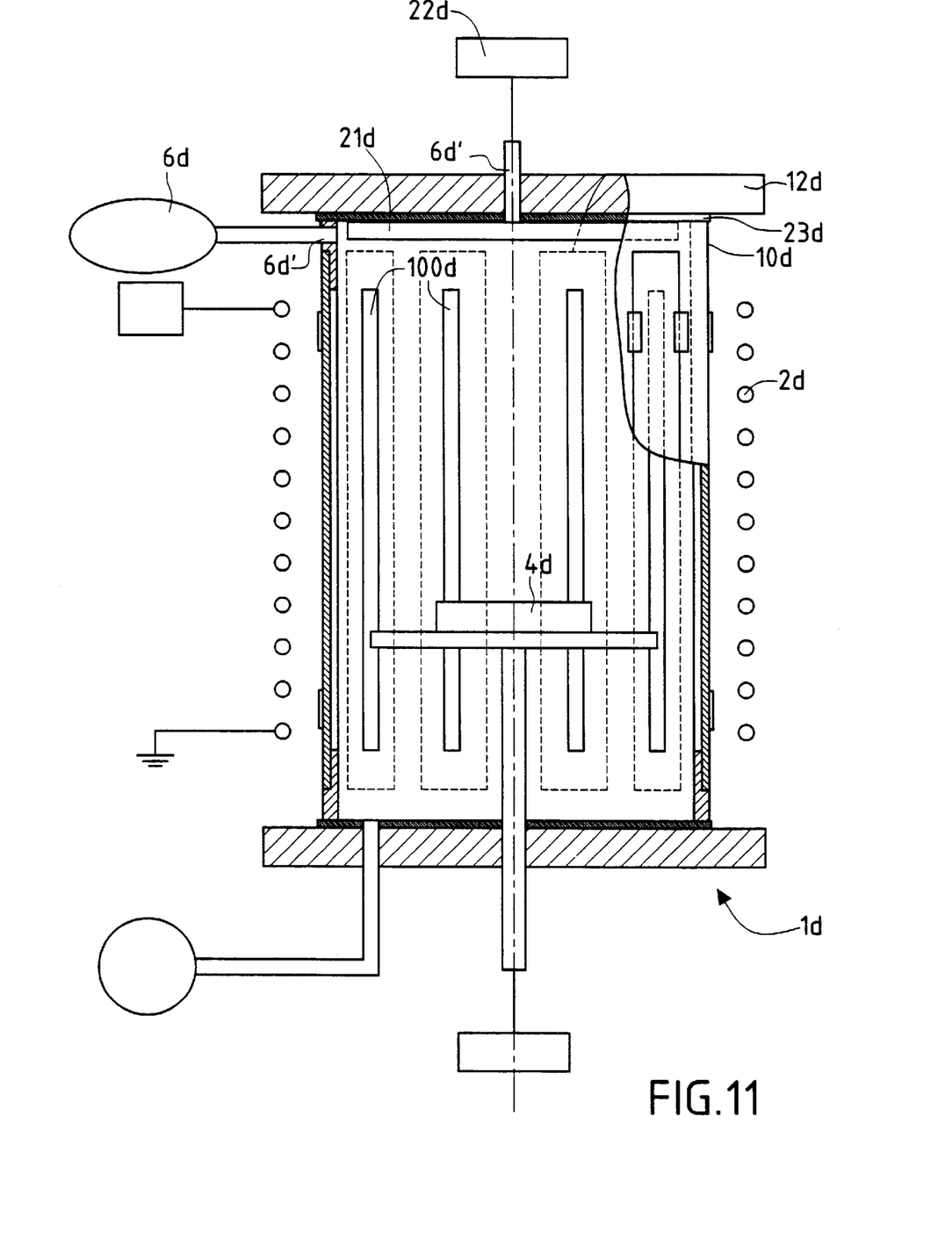
FIG. 11 is a partial sectional front view showing a plasma apparatus according to a fifth embodiment of the present invention.

FIG. 11 shows a plasma apparatus according to a fifth embodiment of the present invention. The plasma apparatus according to this fifth embodiment serves to carry out a sputtering process, wherein material to be deposited on a substrate is sputtered from a target.

The construction of this plasma apparatus differs from that of the first embodiment in that a target 21d, i.e. a material source, is sealed on the upper plate 12d of the plasma chamber 1d. A DC voltage source (or DC pulsed source) 22d is connected to the target 21d to enable the sputtering of the material to be deposited. As the plasma chamber 1d is preferably grounded, the target 21d is electrically isolated from the upper plate 12d by an insulating ring 23d. A magnetron (not shown) may be added to this arrangement to enhance the sputtering efficiency. In this case, the gas inlet 6d' connected to the gas controller 6d is placed on the top of the lateral wall 10d.

Figure 12:
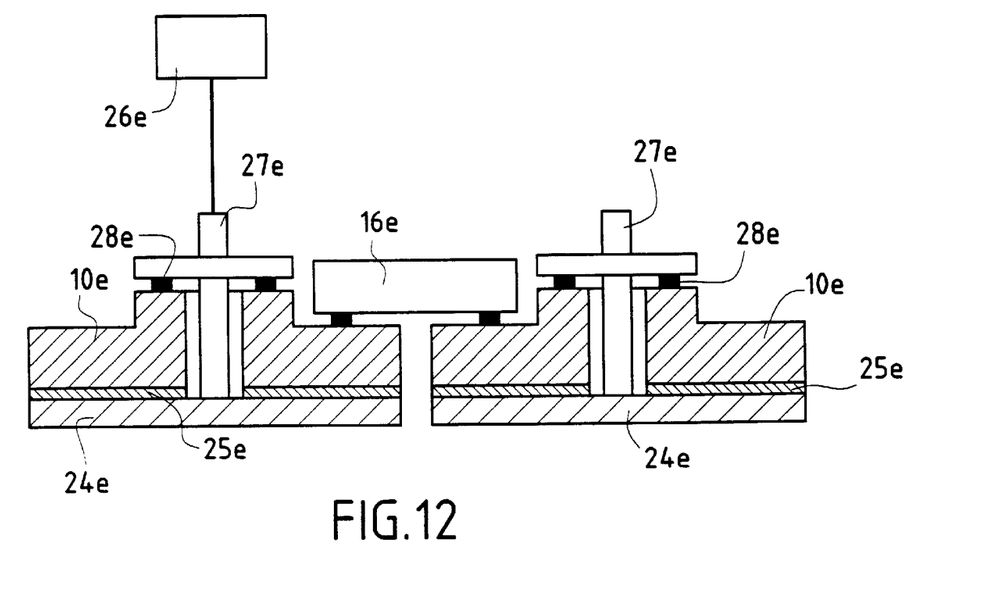
FIG. 12 is a diagrammatic top view of a part of a plasma chamber wall included in a plasma apparatus according to a sixth embodiment of the present invention.

FIG. 12 shows a sixth embodiment of the present invention. The plasma apparatus according to this sixth embodiment is identical to that of the first embodiment, except that it comprises sputtering targets 24e disposed on the conductive wall 10e towards the interior of the plasma chamber. The sputtering targets 24e are made from the material to be deposited on the substrate. Preferably, the conductive wall 10e is grounded, and the targets 24e are electrically insulated from the conductive wall 10e by electrical insulators 25e. Each target 24e is connected to a DC voltage source or a DC pulsed source 26e by an electrical lead 27e in order to enable sputtering operations. Each electrical lead 27e is electrically insulated from the conductive wall 10e by seals 28e.

In each one of the six embodiments described above, cooling means may be provided in order to cool the conductive wall 10, 10a, 10b, 10c, 10d, for example in the manner as explained in EP-A-0908922.

What is claimed is:

1. Plasma processing apparatus comprising:
   a plasma chamber (1) comprising an electrically conductive wall (10), wherein said electrically conductive wall has one or more apertures (100) for interrupting a current path (19) in said wall when electromagnetic energy is provided into the chamber from the outside of the chamber,
   an external electromagnetic supply arrangement arranged to supply electromagnetic energy into said plasma chamber through said electrically conductive wall in order to create a plasma inside the chamber, and
   sealing means for sealing said one or more apertures,
   wherein said sealing means comprises one or more electrically conductive closing elements (16) mounted onto said electrically conductive wall, each aperture being sealed by one of said electrically conductive closing elements (16), said electrically conductive closing elements being electrically insulated from said electrically conductive wall.

2. Apparatus according to claim 1, wherein said one or more apertures (100) extend in a first direction (11) which is substantially parallel to the magnetic field induced by said external electromagnetic supply arrangement, so as to interrupt a current path through said electrically conductive wall in a direction orthogonal to said first direction.

3. Apparatus according to claim 1, wherein said electrically conductive wall (10) extends in a direction parallel to a longitudinal axis (11) of said plasma chamber.

4. Apparatus according to claim 3, wherein said one or more apertures (100) extend in a direction which is substantially parallel to said longitudinal axis (11) of said plasma chamber, so as to interrupt a current path through said electrically conductive wall in a direction orthogonal to said longitudinal axis.

5. Apparatus according to claim 1, wherein said plasma chamber (1) further comprises end plates (12, 13) at opposite ends of said electrically conductive wall (10).

6. Apparatus according to claim 1, wherein said plasma chamber (1) is cylindrical, said electrically conductive wall forming the cylindrical face of said plasma chamber.

7. Apparatus according to claim 1, wherein said plasma chamber (1) is parallelepiped, said electrically conductive wall comprising plane adjacent faces of said chamber.

8. Apparatus according to claim 1, wherein said external electromagnetic supply arrangement comprises an inductor (2) surrounding said electrically conductive wall (10) and connected to an AC power supply (20).

9. Apparatus according to claim 1, wherein said sealing means comprises at least one electrically non-conductive gasket (17) for electrically insulating said one or more electrically conductive closing elements (16) from said conductive wall (10).

10. Apparatus according to claim 9, wherein said at least one gasket (17) is disposed in such a manner as to be in indirect line of sight from the interior of the plasma chamber (1).

11. Apparatus according to claim 9, wherein said at least one gasket (17) is made from a dielectric material.

12. Apparatus according to claim 1, wherein said one or more electrically conductive closing elements (16a) are mounted on an external surface (103a) of said electrically conductive wall (10a).

13. Apparatus according to claim 1, wherein said one or more apertures (100) comprises a narrow portion (101) emerging into the plasma chamber (1) and a wider portion (102), communicating with said narrow portion and forming a recess on an external surface (103) of said electrically conductive wall, and in that a conductive closing element (16) is mounted in said recess.

14. Apparatus according to claim 1, wherein each of said one or more apertures comprises a plurality of apertures (100), said one or more electrically conductive closing elements comprises a plurality of electrically conductive closing elements (16), and in that each one of said plurality of conductive closing elements (16) is mounted on said electrically conductive wall (10) in registration with a corresponding one of said plurality of apertures (100).

15. Apparatus according to claim 14, wherein:
said sealing means comprises at least one electrically non-conductive gasket (17) for electrically insulating said one or more conductive closing elements (16) from said conductive wall (10),
said at least one gasket comprises a plurality of gaskets (17a),
each one of said plurality of gaskets surrounds, on an external surface (103a) of said electrically conductive wall (10a), a corresponding one of said plurality of apertures (100a), and
each one of said plurality of electrically conductive closing elements (16a) is applied on a corresponding one of said plurality of gaskets.

16. Apparatus according to claim 9, wherein:
said sealing means comprises at least one electrically non-conductive gasket (17) for electrically insulating said one or more electrically conductive closing elements (16) from said conductive wall (10)
each one of said one or more apertures (100) comprises a narrow portion (101) emerging into the plasma chamber (1) and a wider portion (102), communicating with said narrow portion and forming a recess on an external surface (103) of said electrically conductive wall (10),
said at least one gasket comprises a plurality of gaskets (17),
each one of said plurality of gaskets surrounds, in the recess of a corresponding aperture, the narrow portion of said corresponding aperture, and
each one of said plurality of electrically conductive closing elements (16) is applied on a corresponding gasket in the recess of a corresponding aperture.

17. Apparatus according to claim 9, wherein said at least one gasket (17b) and said one or more electrically conductive closing elements (16b) are removably mounted on said conductive wall (10b).

18. Apparatus according to claim 1, including a gap (d) between said one or more electrically conductive closing elements (16b) and said conductive wall (10b), wherein the dimension of said gap is determined according to Paschen's law.

19. Apparatus according to claim 18, wherein said gap is less than one millimeter.

20. Apparatus according to claim 1, wherein said plasma chamber (1d) further comprises at least one sputtering target (21d).

21. Apparatus according to claim 20, wherein said at least one sputtering target (24e) is disposed on an inner surface of said conductive wall (10e).

22. Apparatus according to claim 21, including
at least one insulating plate (25e) interposed between said at least one sputtering target (24e) and the inner surface of said conductive wall (10e), and
said at least one sputtering target (24e) is connected to a power source (26e) by a lead (27e) crossing said conductive wall and electrically insulated from said conductive wall.

23. Apparatus according to claim 1, wherein said electrically conductive wall (10) and/or said one or more electrically conductive closing elements (16) are made from metal.

24. Apparatus according to claim 1, wherein each one of said one or more apertures (100) is in the form of a slot.

25. Apparatus according to claim 1, wherein said one or more electrically conductive closing elements (16) comprise at least one electrically conductive plate.

26. Apparatus according to claim 1, wherein said plasma chamber (1c) comprises at least one gas inlet (6c') formed on said electrically conductive wall (10c).

27. Apparatus according to claim 26, wherein said at least one gas inlet comprises a plurality of gas inlets (6c') provided at regular intervals on said electrically conductive wall (10c).

28. Apparatus according to claim 26, said plasma chamber (1) further comprises end plates (12, 13) at opposite ends of said electrically conductive wall (10) and wherein said plasma chamber (1c) further comprises a gas inlet (6c") formed on a cover plate (12c).

29. Apparatus according to claim 1, further comprising a cooling arrangement arranged to cool said electrically conductive wall.

* * * * *